United States Patent
Iwasaki et al.

(10) Patent No.: US 6,404,059 B1
(45) Date of Patent: Jun. 11, 2002

(54) SEMICONDUCTOR DEVICE HAVING A MOUNTING STRUCTURE AND FABRICATION METHOD THEREOF

(75) Inventors: Toshihiro Iwasaki; Keiichiro Wakamiya, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/614,175

(22) Filed: Jul. 11, 2000

(30) Foreign Application Priority Data

Feb. 8, 2000  (JP) ........................... 2000-030651

(51) Int. Cl.[7] ............................................. H01L 23/48
(52) U.S. Cl. ............................. 257/774; 257/719
(58) Field of Search ........................ 257/738, 698, 257/778, 774, 701, 719, 775, 782; 361/723; 438/126, 118; 174/250

(56) References Cited

U.S. PATENT DOCUMENTS

| | | | | |
|---|---|---|---|---|
| 5,640,047 A | * | 6/1997 | Nakashima | 257/738 |
| 5,708,567 A | * | 1/1998 | Shim et al. | 361/723 |
| 5,756,380 A | * | 5/1998 | Berg et al. | 438/126 |
| 5,866,942 A | * | 2/1999 | Suzuki et al. | 257/698 |
| 5,953,592 A | * | 9/1999 | Taniguchi et al. | 438/118 |
| 6,031,292 A | * | 2/2000 | Murakami et al. | 257/778 |
| 6,268,568 B1 | * | 7/2001 | Kim | 174/250 |

FOREIGN PATENT DOCUMENTS

| | | |
|---|---|---|
| JP | 9-148479 | 6/1997 |
| JP | 11-74645 | 3/1999 |

* cited by examiner

Primary Examiner—David Nelms
Assistant Examiner—Bau T Le
(74) Attorney, Agent, or Firm—McDermott, Will & Emery

(57) ABSTRACT

A semiconductor device comprises an insulated circuit board which includes a terminal electrode disposed on the rear surface or at a plane between the rear surface and the front surface thereof. An opening is formed in the insulating circuit board in such a manner as to reach the terminal electrode. A semiconductor substrate including an electrode pad is mounted on the insulated circuit board in such a manner that the electrode pad faces to the terminal electrode. A non-conductive resin is interposed in a gap between the semiconductor substrate and the insulated circuit board. The electrode pad on the semiconductor substrate is electrically connected to the terminal electrode via a connecting conductor inserted in the opening.

20 Claims, 8 Drawing Sheets

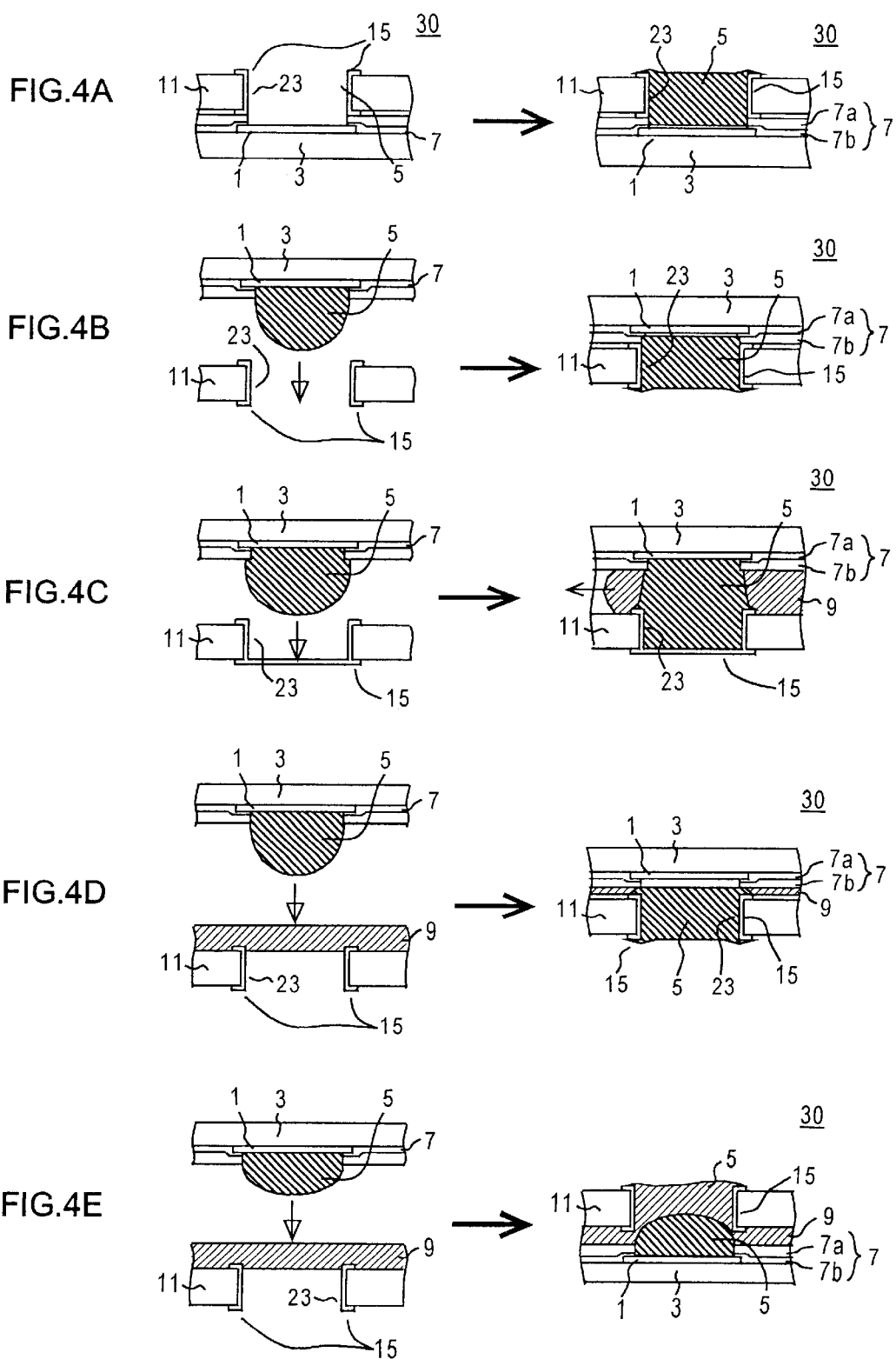

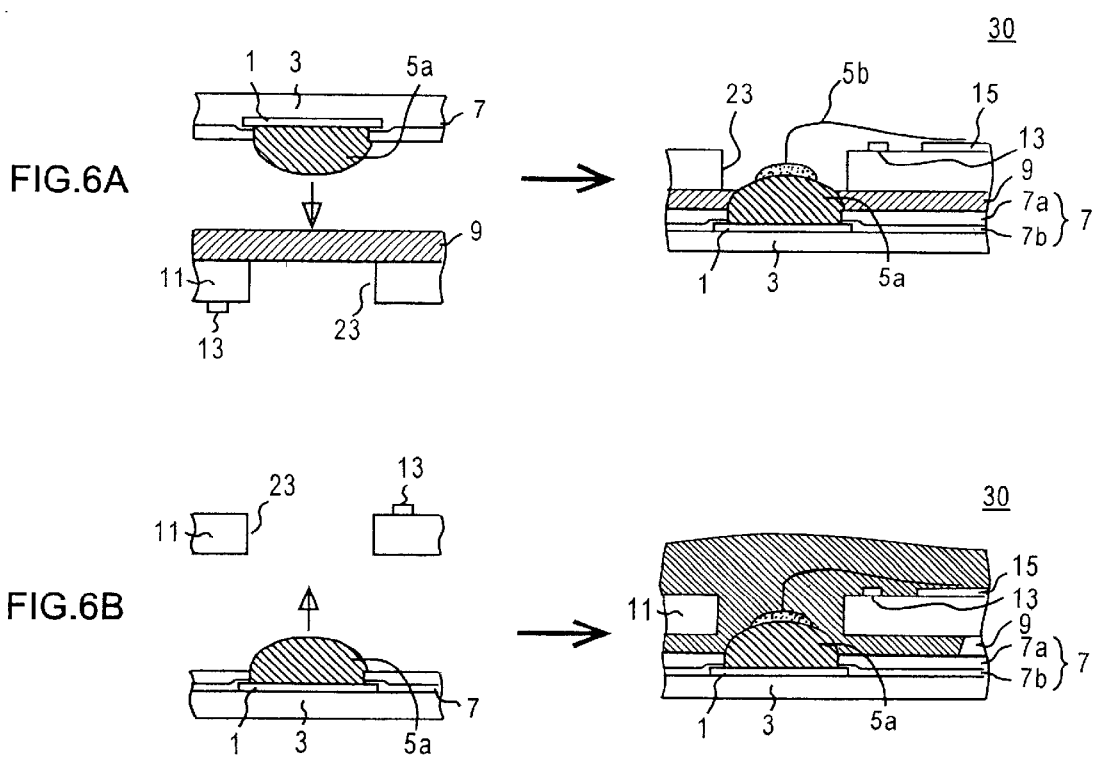

SEMICONDUCTOR DEVICE HAVING A MOUNTING STRUCTURE AND FABRICATION METHOD THEREOF

BACKGROUND OF THE INVENTION

1. Field of the Invention

The present invention relates to a technique for mounting a semiconductor substrate to an insulated circuit board, and particularly to a semiconductor device and a fabrication method thereof in which an electrode pad on a semiconductor substrate is connected to a terminal electrode of an insulated circuit board via a connecting conductor by making use of an opening provided in the insulated circuit board.

2. Background Art

FIG. 8 is a sectional view of a connection portion between a semiconductor substrate and an insulated circuit board and its neighborhood in a prior art semiconductor device in which the semiconductor substrate is mounted on the insulated circuit board. In FIG. 8, reference numeral 3 designates a semiconductor substrate; 1 designates an electrode pad of the semiconductor substrate 3; 25 is an underlying metal film connection portion provided on the electrode pad 1; 7 is a protective insulation film of the semiconductor substrate. Reference numeral 11 designates an insulated circuit board; 15 is a terminal electrode of the insulated circuit board 11; 31 is a bump (eutectic solder) for connecting the electrode pad 1 and the terminal electrode 15; 21 is a sealing resin for sealing the gap between the semiconductor substrate 3 and the insulated circuit board 11; 27 is a solder resist; and 30' is a prior art semiconductor device including the above mentioned portions.

A method of manufacturing a prior art semiconductor device 30' by mounting a semiconductor substrate 3 on an insulated circuit board 11 will be described with reference to FIG. 8. The semiconductor substrate 3 has an underlying metal film connection portion 25 connected to the electrode pad 1 through the opening formed in the protective insulation film 7. The semiconductor substrate 3 is mounted on the insulated circuit board 11 in such a manner that the underlying metal film portion 25 is aligned to the bump 31 formed on the terminal electrode 15. In such a state, the bump 31 is melted to join to the underlying metal film portion 25, and then a gap between the semiconductor substrate 3 and the insulated circuit board 11 is sealed with a sealing resin 21.

The prior art method, however, has the following problem. As the arrangement pitch of the electrode pads 1 becomes narrower along with the higher degree of integration of a semiconductor device, a gap between the semiconductor substrate 3 and the insulated circuit board 11 becomes narrower. Accordingly, there possibly occurs mismatching between the semiconductor substrate 3 and the insulated circuit board 11 due to thermal expansion, and thereby the stress applied to the bumps 31 is increased.

SUMMARY OF THE INVENTION

An object of the present invention is to provide a semiconductor device in which an electrode pad on a semiconductor substrate is connected to a terminal electrode of an insulated circuit board via a connecting conductor by making use of an opening provided in the insulated circuit board, thereby improving the reliability in connecting the electrode pads on the semiconductor substrate to the insulated circuit board and also ensuring the reliability in connecting the electrode pads on the semiconductor substrate to the insulated circuit board even in the case where the arrangement pitch of the electrodes becomes narrower along with the higher degree of integration of the semiconductor device, and to provide a fabrication method thereof.

According to one aspect of the present invention, a semiconductor device comprises a semiconductor substrate including an electrode pad. An insulated circuit board is provided which has a main surface and a rear surface, and is disposed with its main surface facing the electrode pad of the semiconductor substrate. The insulated circuit board has a terminal electrode disposed at the rear surface or between the main surface and the rear surface, and has an opening at a position opposite to the electrode pad and formed from the main surface up to the terminal electrode. A connecting conductor is disposed through the opening, and connects the electrode pad on the semiconductor substrate with the terminal electrode on the insulated circuit board.

According to another aspect of the present invention, in a semiconductor device, an insulated circuit board has a terminal electrode disposed on the inner surface of an opening formed in the insulated circuit board. A connecting conductor is disposed through the opening, and connects the electrode pad on the semiconductor substrate with the terminal electrode on the insulated circuit board.

According to another aspect of the present invention, in a semiconductor device, the insulated circuit board has a terminal electrode at the rear surface or at a plane between the main surface and the rear surface surrounding the opening. A connecting conductor is disposed through the opening, and connects the electrode pad on the semiconductor substrate with the terminal electrode on the insulated circuit board.

According to another aspect of the present invention, in a semiconductor device, an insulated circuit board has a terminal electrode at a position on the rear surface near the opening. A connecting conductor is disposed through the opening, and connects the electrode pad on the semiconductor substrate with the terminal electrode on the insulated circuit board.

Other and further objects, features and advantages of the invention will appear more fully from the following description.

BRIEF DESCRIPTION OF THE DRAWINGS

FIGS. 4A to 4E are sectional views each showing a connection portion between the semiconductor substrate and the insulated circuit board and its neighborhood in the semiconductor device according to the second embodiment for illustrating a method of fabricating the semiconductor device;

FIGS. 6A and 6B are sectional views each showing a connection portion between the semiconductor substrate and the insulated circuit board and its neighborhood in the semiconductor device according to the third embodiment for illustrating a method of fabricating the semiconductor or device;

DETAILED DESCRIPTION OF THE PREFERRED EMBODIMENTS

First Embodiment

Figure 1A:
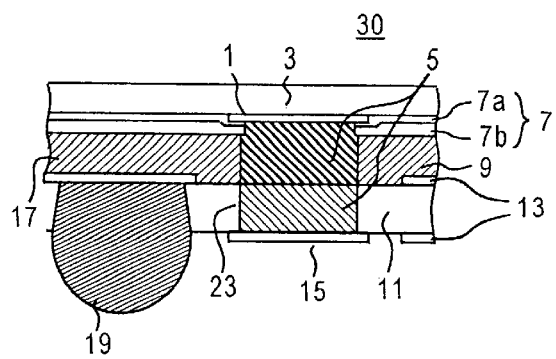
FIGS. 1A to 1E are sectional views each showing a connection portion between a semiconductor substrate and an insulated circuit board and its neighborhood in a semiconductor device according to a first embodiment of the present invention.

Hereinafter, a first embodiment of the present invention will be described in detail with reference to the drawings. FIGS. 1A to 1E are sectional views each showing a connecting portion between a semiconductor substrate and an insulated circuit board and its neighborhood in a semiconductor device according to a first embodiment of the present invention.

In FIGS. 1A to 1E, reference numeral 3 designates a semiconductor substrate; 1 designates an electrode pad of the semiconductor substrate 3; and 7 is a protective insulation film of the semiconductor substrate 3. In this embodiment, the protective insulation film 7 is composed of two layers of, for example, a glass coat 7a and a polyimide layer 7b, but not limited to the structure like this.

Reference numeral 11 designates an insulated circuit board; 13 is a conductive layer formed on the insulated circuit board 11; is a terminal electrode of the insulated circuit board 11; 17 is an external terminal connection electrode formed on the insulated circuit board 11; 19 is an external terminal connected on the external terminal connection; electrode 17; and 23 is an opening, i.e., a through-hole or a via-hole. Reference numeral 5 designates a connecting conductor provided in the opening 23; 9 is a non-conductive resin provided between the semiconductor substrate 3 and the insulated circuit board 11, and 30 is a semiconductor device including the above mentioned portions according to the first embodiment.

As shown in FIG. 1A, in a first example of a semiconductor device 30 according to this first embodiment, an electrode pad 1 is provided on the surface of the semiconductor substrate 3 through an opening of a protective insulation film 7 formed to cover the semiconductor substrate 3. The conductive layers 13 are respectively formed on the front surface (main surface) facing the semiconductor substrate 3 and on the rear surface of the insulated circuit board 11. The opening 23 is formed in the insulated circuit board 11 at a position opposite the electrode pad 1 of the semiconductor substrate 3, and the terminal electrode 15 is provided at the bottom of the opening 23, i.e., on the rear surface of the insulated circuit board 11.

The semiconductor substrate 3 thus formed is mounted on the insulated circuit board, and the electrode pad 1 is electrically connected to the terminal electrode 15 via the connecting conductor 5 provided in the opening 23. Further, a gap between the semiconductor substrate 3 and the insulated circuit board 11 is sealed with the non-conductive resin 9.

According to the semiconductor device 30 in this embodiment, as shown in FIG. 1A, the electrode pad 1 is electrically connected to the terminal electrode 15 formed on the rear surface of the insulated circuit board 11 via the connecting conductor 5 inserted in the opening 23 formed in the insulated circuit board 11. Thus, the height of the connecting conductor 5 is ensured, and the stress applied to the connecting conductor 5 is lowered, which stress is caused by mismatching between the semiconductor substrate 3 and the insulated circuit board 11 due to thermal expansion.

The connecting conductor 5 may be formed of a continuous body of a same substance, or alternatively may be made from a plurality of kinds of materials formed in a stacked fashion.

Further, the connection of the connecting conductor 5 with the terminal electrode 15 is not for heat dissipation purpose. Accordingly, the terminal electrode 15 connected with the connecting conductor 5 is not necessarily required to be connected to an external terminal 19. In the same context, the terminal electrode 15 may not be required to be exposed, and may be covered by some other layer.

In the semiconductor device 30 of this example, the conductive layers 13 are formed on the front and rear surfaces of the insulated circuit board 11, so that the degree of freedom in design of the conductive layers 13 of the insulated circuit board 11 can be improved. Further, as shown in the left part of FIG. 1A, an external terminal connection electrode 17 is provided on the front surface of the insulated circuit board 11, so that an external terminal 19 can be connected via an opening to the external terminal connection electrode 17.

The gap between the semiconductor substrate 3 and the insulated circuit board 11 is filled with the non-conductive resin 9 to relieve the stress caused by mismatching between the semiconductor substrate 3 and the insulated circuit board 11 due to thermal expansion.

Figure 1B:
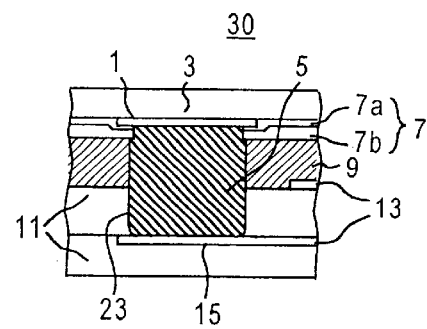

Next, as shown in FIG. 1B, in a second example of a semiconductor device 30 according to the first embodiment, the insulated circuit board 11 is formed from a plurality of stacked boards, and the terminal electrode 15 is formed at an intermediate board layer in the insulated circuit board 11. An opening, i.e., a via-hole in this case, is formed from the front surface up to the terminal electrode 15. A connecting conductor 5 connects the electrode pad 1 and the terminal electrode 15 in the intermediate board layer through the opening 23. An arrow in the drawing indicates to press down the semiconductor substrate 3 toward the insulated circuit board 11.

In this device structure, the same function and effect are obtained as those obtained by the device structure shown in FIG. 1A. To be more specific, in a semiconductor device having an insulated circuit board 11 composed of a multi-layer structure, the stress caused in the connecting conductor 5, which electrically connects the semiconductor substrate 3 to the insulated circuit board 11, is lowered.

Figure 1C:
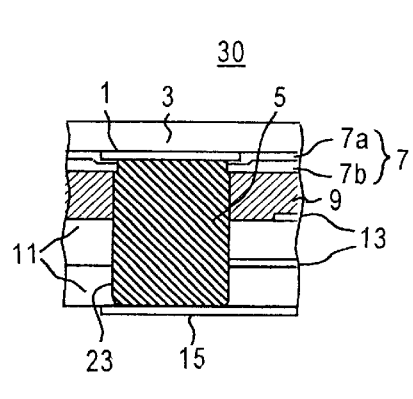

Next, as shown in FIG. 1C, in a third example of a semiconductor device 30 according to the first embodiment, an insulated circuit board 11 is composed of stacked two board layers, and conductive layers 13 are formed on each surface of the board layers. A terminal electrode 15 is formed on the rear surface of the insulated circuit board 11, i.e. on the opposite side of the front side facing the semiconductor substrate 3. An opening 23 is formed in the insulated circuit board 11 at a position corresponding to the electrode pad 1, and reaches the terminal electrode 15 from the front side. A connecting conductor 5 is provide in the opening 23 to electrically connect the electrode pad 1 and the terminal electrode 15. At this time, an intermediate conductive layer 13 is also electrically connected to the connecting conductor 5. That is to say that more than two conductive layers 13 may be connected to the connecting conductor 5. The device structure as shown in FIG. 1C has the same function and effect as those obtained by the device structure shown in FIG. 1A.

Figure 1D:
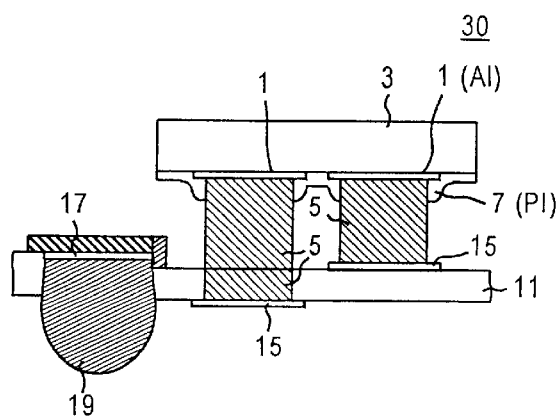

Next, as shown in FIG. 1D, in a fourth example of a semiconductor device 30 according to the first embodiment, a connecting conductor 5 as shown in FIG. 1A is provided which penetrates an insulated circuit board 11 through an opening 23, and an usual connecting conductor 5 which does not penetrate the insulated circuit board 11 is also provided. The electrode pad 1 is basically made from aluminum (Al), and the electrode pad 1 and its neighborhood on the semiconductor substrate are covered with an insulating resin (PI).

In the above mentioned embodiments, the gap between the inner wall of the opening 23 and the connecting conductor 5 may be vacant or may be embedded with a non-conductive resin. The connecting conductor 5 may partially contact the inner wall of the opening 23. Alternatively, the connecting conductor 5 may not contact the inner wall of the opening 23 at all. Such loose configuration may reduce the stress applied to the connecting conductor 5 rather than the tight configuration.

Further, the insulated circuit board 11 may be configured as an insulated circuit board having a multi-layer structure of board layers, wherein two conductive layers 13 are provided on both surfaces of at least one board layer.

Figure 1E:
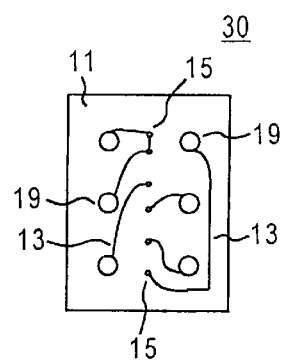

Next, FIG. 1E shows a plan view of the rear surface of an insulated circuit board 11. A row of a plurality of terminal electrodes 15 is disposed at around a centering line of the insulated circuit board 11, and two rows of a plurality of external terminals 19 are disposed at each sides of the row of the terminal electrodes 15. Each terminal electrode 15 and external terminal 19 is connected by a conductive layer or conducive line 13.

Figure 2A:
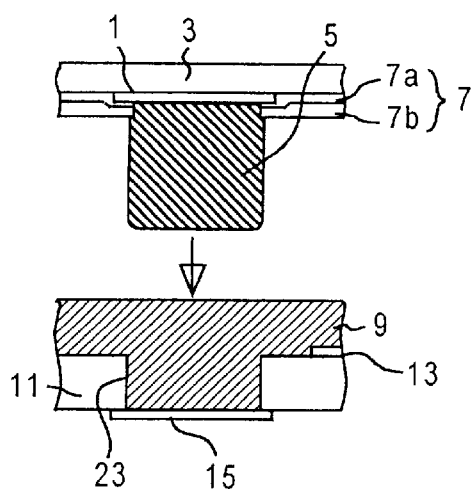
FIGS. 2A and 2B are sectional views each showing a connection portion between the semiconductor substrate and the insulated circuit board and its neighborhood in the semiconductor device according to the first embodiment for illustrating a method of fabricating the semiconductor device.
Figure 2B:
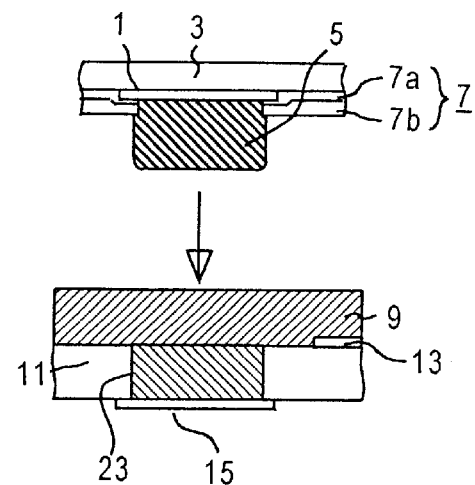

Now, a method of fabricating the semiconductor device 30 according to the first embodiment will be described with reference to FIGS. 2A and 2B. FIGS. 2A and 2B are sectional views each showing the connection portion between the semiconductor substrate and the insulated circuit board and its neighborhood in the semiconductor device according to this embodiment for illustrating the method of fabricating the semiconductor device.

As shown in FIG. 2A, in a first example of a method of fabricating a semiconductor device according to this first embodiment, a connecting conductor 5 is formed on the electrode pad 1 provided on the surface of the semiconductor substrate 3 through an opening of the protective insulation film 7 covering the semiconductor substrate 3. A non-conductive resin 9 is positioned on an insulated circuit board 11. A semiconductor substrate 3 is so positioned on the insulated circuit board 11 that the connecting conductor 5 is located above the terminal electrode 15, and connecting conductor 5 is pressure-joined to the terminal electrode 15 under heating. The non-conductive resin 9 seals the gap between the semiconductor substrate 3 and the insulated circuit board 11.

In this case, the connecting conductor 5 is not joined to the inner wall surface of the opening 23 formed in the insulated circuit board 11, and the electrode pad 1 is electrically connected to the connecting conductor 5 via the terminal electrode 15. Accordingly, as compared with the device structure with no opening 23, the connecting conductor 5 becomes higher by a value equivalent to the height of the insulated circuit board 11.

Next, as shown in FIG. 2B, in a second example of a method of fabricating a semiconductor device according to the first embodiment, one connecting conductor 5 is formed on the electrode pad 1 provided on the surface of the semiconductor substrate 3, and another connecting conductor 5 is formed on the terminal electrode 15 on the insulated circuit board 11, i.e, in the opening 23. Then, the both of the connecting conductors 5 are faced with the non-conductive resin 9 therebetween, and pressure-joined under heating. Thus, the electrode pad 1 is connected to the terminal electrode 15 via the connecting conductor 5. In this example, the materials of the connecting conductors 5 formed on the electrode pad 1 and the terminal electrode 15 may be different from each other.

In general, as the arrangement pitch of the electrode pads 1 becomes narrower, the diameter of the connecting conductor 5 formable on the electrode pad 1 of the semiconductor substrate 3 become smaller and also the height of the connecting conductor 5 becomes lower. In accordance with this embodiment, the connecting conductor 5 is previously formed in the opening 23 of the insulated circuit board 11, and the electrode pad 1 is pressure-joined to the terminal electrode 15 via the connecting conductor 5. Thus, the height of the connecting conductor 5 is ensured to secure stable structure.

In this embodiment, the connecting conductor 5 can be formed on the electrode pad 1 by a bump stud bonding method, a film formation technique, or the like using an eutectic solder or gold (Au). The opening 23 can be formed in the insulated circuit board 11 by a laser processing method or the like. The gap between the semiconductor substrate 3 and the insulated circuit board 11 can be filled with the non-conductive resin 9, typically, by heating and pressing the non-conductive resin 9 supplied in the form of an epoxy resin film. A multi-layer thin film may be formed on the surface of either the electrode pad 1 or the terminal electrode 15 for improving the adhesion characteristic of the connecting conductor 5.

As described above, according to the first embodiment, it is possible to increase the height of the connecting conductor 5 by making use of the opening 23 formed in the insulated circuit board 11. Further, it is possible to avoid the increase in stress caused in the connecting conductor 5 by connecting the connecting conductor 5 to the terminal electrode 15 on the back surface of the insulated circuit board 11 via the opening 23.

Further, it is possible to reduce the stress applied to the connecting conductor 5 by making a gap between the connecting conductor 5 and the inner wall surface of the opening 23. Alternatively, it is possible to increase the joining strength between the semiconductor substrate 3 and the insulated circuit board 11 by making use of the inner wall surface of the opening 23 as the joining area.

As a result, there can be obtained effects of improving the reliability in connecting the electrode pad 1 on the semiconductor substrate 3 to the insulated circuit board 11, and of ensuring the reliability in connecting the electrode pad 1 on the semiconductor substrate 3 to the insulated circuit board 11 even if the arrangement pitch of the electrode pads 1 becomes narrower along with the higher degree of integration of the semiconductor device.

Second Embodiment

Hereinafter, a second embodiment of the present invention will be described in detail with reference to the drawings. FIGS. 3A to 3F are views each showing a connection portion between a semiconductor substrate and an insulated circuit board and its neighborhood in a semiconductor device according to the second embodiment of the present invention.

In FIGS. 3A to 3F, reference numeral 3 designates a semiconductor substrate; 1 designates an electrode pad of the semiconductor substrate 3; and 7 is a protective insulation film of the semiconductor substrate 3. In this embodiment, the protective insulation film 7 is composed of two layers of, for example, a glass coat 7a and a polyimide layer 7b, but not limited to the structure like this.

Reference numeral 11 designates an insulated circuit board; 13 is a conductive layer formed on the insulated circuit board 11; is a terminal electrode of the insulated circuit board 11; and 23 is an opening, i.e., a through-hole or a via-hole. Reference numeral 5 designates a connecting conductor provided in the opening 23; 9 is a non-conductible resin provided between the semiconductor substrate 3 and the insulated circuit board 11, and is a semiconductor device including the above mentioned portions according to the first embodiment.

Figure 3A:
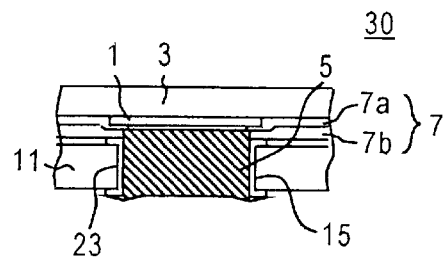
FIGS. 3A to 3F are sectional views each showing a connection portion between a semiconductor substrate and an insulated circuit board and its neighborhood in a semiconductor device according to a second embodiment of the present invention.

As shown in FIG. 3A, in a first example of a semiconductor device 30 according to this second embodiment, a terminal electrode 15 is formed on the innerwall surface of an opening 23 formed in an insulated circuit board 11. An electrode pad 1 provided on a semiconductor substrate 3 is connected to the terminal electrode 15 via the connecting conductor 5. Such a device structure is effective to increase the joining area of the connecting conductor 5 with the terminal electrode 15 and also increase the height of the connecting conductor 5, and hence to improve the connection reliability.

Figure 3B:
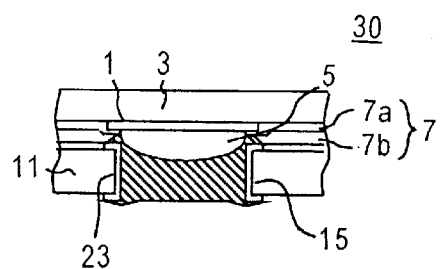

Next, as shown in FIG. 3B, in a second example of a semiconductor device 30 according to the first embodiment, a part of a connecting conductor 5 is formed on a electrode pad 1 on the semiconductor substrate 3, and another part of a connecting conductor 5 is formed on the terminal electrode 15 in the opening 23. Then, the both part of the connecting conductor 5 are joined to connect electrode pad 1 with the terminal electrode 15. In this case, each part of the connecting conductor 5 may be made of different materials.

Figure 3C:
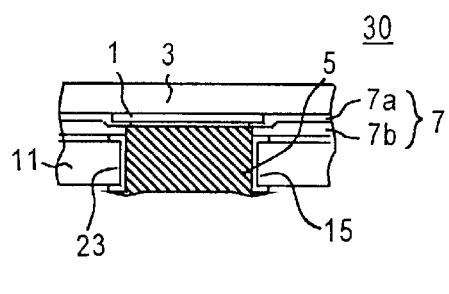

Next, as shown in FIG. 3C, in a third example of a semiconductor device 30 according to the first embodiment, each terminal electrode 15 is formed on both of the front surface and the rear surface of the insulated circuit board 11 around the opening 23, but not on the inner surface of the opening 23. This structures may be used in consideration of the productivity.

In the device structures shown in FIGS. 3A to 3C, the semiconductor substrate 3 is mounted on the insulated circuit board 11 only by the connecting conductor 5. The semiconductor substrate 3 covered by the the protective insulation film 7 is directly contacting the insulated circuit board 11, and a non-conductive resin layer is disposed between the semiconductor substrate 3 and the insulated circuit board 11. Alternatively, the semiconductor substrate 3 may be fixed to the insulated circuit board 11 by using a jig or an adhesion force applied between the semiconductor substrate 3 and the insulated circuit board 11.

In the device structure shown in FIG. 3B, the semiconductor substrate 3 is fixed to the insulated circuit board 11 as explained above, or by using the projection (i.e., connecting conductor 5) formed on the semiconductor substrate 3. Usually, the semiconductor substrate 3 is fixed to the insulated circuit board 11 by making use of the contact between the connecting conductor 5 formed on the electrode pad 1 and the opening 23.

Figure 3D:
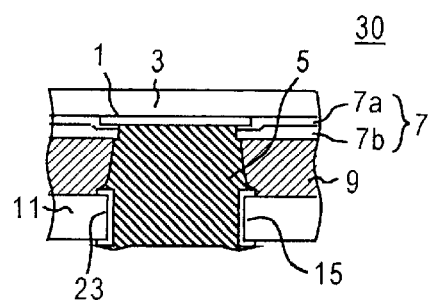
Figure 3E:
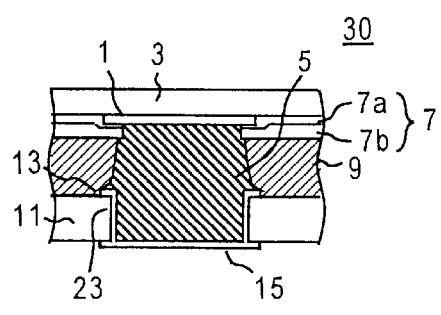

Next, as shown in FIG. 3D and 3E, in a fourth and fifth examples of a semiconductor device 30 according to the first embodiment, a gap between the semiconductor substrate 3 and the insulated circuit board 11 is filled with the non-conductive resin 9. In the structure shown in FIG. 13D, a terminal electrode 15 is formed on the inner wall of the opening 23, i.e. a through-hole. In the structure shown in FIG. 3E, a terminal electrode 15 is formed at the bottom of the opening 23 as well as on the inner wall surface of the opening 23.

Figure 3F:
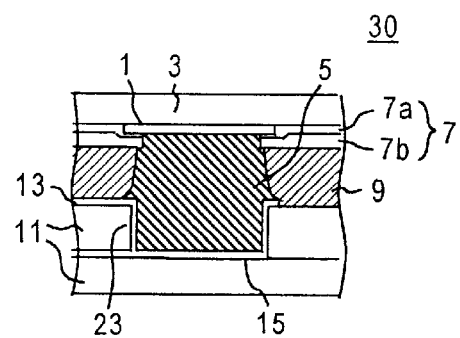

Next, as shown in FIG. 3F, in a sixth example of a semiconductor device 30 according to the first embodiment, an insulated circuit board 11 is composed of a plurality of stacked boards, and a terminal electrode 15 land a conductive layer 13 are formed in the intermediate layer. An opening 23, i.e., a via-hole, is formed from the surface of the insulated circuit board 11 to reach the bottom side of the terminal electrode 15. A connecting conductor 5 is disposed in the opening 23 to connect the electrode pad 1 and the terminal electrode 15.

In the examples shown in FIG. 3D to 3F, the connecting conductor 5 is partly expanded outside of the opening 23 and contacts the terminal electrode 15. The non-conducive resin layer 19 may be a general resin, and need not to be light sensitive.

In this embodiment, the insulated circuit board 11 may be configured as an insulated circuit board having a multi-layer structure, in which at least one board layer has a terminal electrodes 15.

Now, a method of fabricating the semiconductor device according to the second embodiment of the present invention will be described below. FIGS. 4A to 4E are sectional views each showing a connection portion between the semiconductor substrate and the insulated circuit board and its neighborhood according to the second embodiment for illustrating the method of fabricating the semiconductor device. An arrow in the left side drawing indicates to press a semiconductor substrate toward a insulated circuit board, and an arrow between the left side drawing and the right side drawing indicates that the process proceeds from the left side status to the right side status.

As shown in FIG. 4A, in a first example of a method of fabricating a semiconductor device according to this first embodiment, the semiconductor substrate 3 is positioned relative to the insulated circuit board 11 in such a manner that the electrode pad 1 provided on the surface of the semiconductor substrate 3 is aligned to the opening 23 and the terminal electrode 15 formed on the inner surface of the opening 23. Then, the connecting conductor 5 is inserted to the opening 23 to obtain the structure shown in FIG. 3A.

Next, as shown in FIG. 4B, in a second example of a method of fabricating a semiconductor device according to the first embodiment, a connecting conductor 5 is formed on a semiconductor substrate 3. The semiconductor substrate 3 is positioned relative to an insulated circuit board 11 in such a manner that the electrode pad 1 provided on the surface of the semiconductor substrate 3 is aligned to the opening 23 and the terminal electrode 15.

Then, the connecting conductor 5 is inserted into the opening 23, thereby fixing the semiconductor substrate 3 to the insulated circuit board 11, and joining the connecting conductor 5 to the terminal electrode 15 to obtain the structure of FIG. 3A.

Next, as shown in FIG. 4C, in a third example of a method of fabricating a semiconductor device according to the first embodiment, a connecting conductor 5 is attached to the electrode pad 1 on the semiconductor substrate 3. The semiconductor substrate 3 is positioned relative to the insulated circuit board 11 in such a manner that the electrode pad 1 is aligned to the opening 23 and the terminal electrode 15. Then, the connecting conductor 5 is inserted in the opening 23 until the connecting conductor 5 is brought into contact with the bottom portion of the terminal electrode 15, thereby fixing the semiconductor substrate 3 to the insulated circuit board 11.

Next, as shown in FIG. 4D, in a third example of a method of fabricating a semiconductor device according to the first embodiment, a connecting conductor 5 is fixed to the electrode pad 1 on the semiconductor substrate 3. A non-conductive resin 9 is disposed on a insulated circuit board 11. The semiconductor substrate 3 is positioned relative to the insulated circuit board 11 in such a manner that the electrode pad 1 on the semiconductor substrate 3 is aligned to the opening 23 and the terminal electrode 15 formed on the inner surface of the opening 23. Then, the connecting conductor 5 (i.e., a projection) is pressed and brought into contact with the terminal electrode 15. The non-conductive resin 9 fixes the semiconductor substrate 3 and the insulated circuit board 11.

Next, as shown in FIG. 4E, in a third example of a method of fabricating a semiconductor device according to the first embodiment, a connecting conductor 5 is fixed on the electrode pad 1 of the semiconductor substrate 3. A non-conductive resin 9 is disposed on an insulated circuit board 11. Then, in the same way as in FIG. 4D, the connecting conductor 5 is inserted into the opening 23. In this case, the amount of the connecting conductor on the electrode pad 1 partially fill the opening 23. Then, the additional portion of the connecting conductor 5 is filled in the opening 23 from the side of the insulated circuit board 11. A non-conductive resin 9 is fixed between the semiconductor substrate 3 and the insulated circuit board 11, thereby fixing the semiconductor substrate 3 to the insulated circuit board 11.

In the fabrication method in this embodiment, the connecting conductor 5 may be previously provided in the opening 23. This is effective to omit the etching of the portion, around the opening 23, of the non-conductive resin 9, and hence to relatively easily fabricate the semiconductor device 30.

In the above mentioned embodiments, the gap between the inner wall of the opening 23 and the connecting conductor 5 may be vacant or may be embedded with a non-conductive resin. The connecting conductor 5 may partially contact the inner wall of the opening 23. Alternatively, the connecting conductor 5 may not contact the inner wall of the opening 23 at all. Such loose configuration may reduce the stress applied to the connecting conductor 5 rather than the tight configuration.

Third Embodiment

Figure 5A:
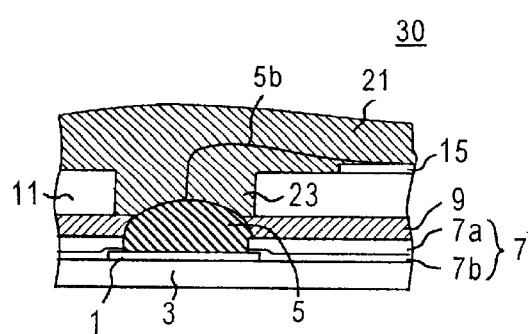
FIGS. 5A to 5C are sectional views each showing a connection portion between a semiconductor substrate and an insulated circuit board and its neighborhood in a semiconductor device according third embodiment of the present invention.
Figure 5B:
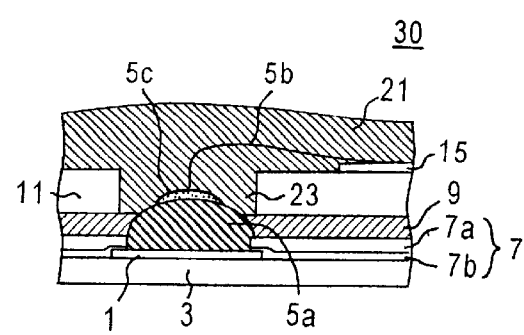
Figure 5C:
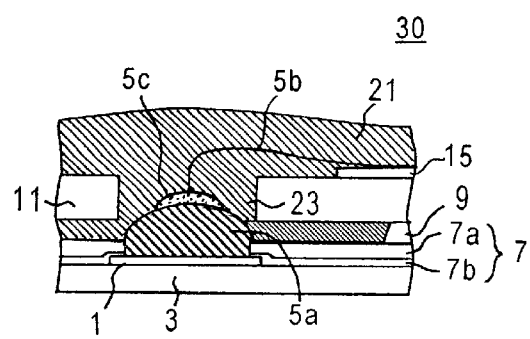

Hereinafter, a third embodiment of the present invention will be described in detail with reference to the drawings. FIGS. 5A to 5C are sectional views each showing a connection portion between a semiconductor substrate and an insulated circuit board and its neighborhood in a semiconductor device according to the third embodiment.

In FIGS. 5A to 5C, reference numeral 3 designates a semiconductor substrate; 1 designates an electrode pad of the semiconductor substrate 3; and 7 is a protective insulation film of the semiconductor substrate 3. In this embodiment, the protective insulation film 7 is composed of two layers of, for example, a glass coat 7a and a polyimide layer 7b, but not limited to the structure like this.

Reference numeral 11 designates an insulated circuit board; 23 is an opening, i.e., a through-hole formed in the insulated circuit board 11; 13 is a conductive layer formed on the insulated circuit board 11 near the opening 23; and 15 is a terminal electrode of the insulated circuit board 11 formed near the opening 23. Reference numeral 5a designates a portion of a connecting conductor provided on the electrode pad 1; 5c is a portion of a connecting conductor provided on the connecting conductor 5a; 5b is a portion of a connecting conductor which connects the portion of the connecting conductor 5a or 5c and the terminal electrode 15 on the insulated circuit board 11. The connecting conductor 5b runs to the terminal electrode 15 over the conducting line 13. Reference numerals 5a, 5b and 5c make a connecting conductor 5. Reference numeral 9 is a non-conductive resin provided between the semiconductor substrate 3 and the insulated circuit board 11, 21 is a non-conductive resin which fills the opening 23 and covers the connecting conductor 5 and the terminal electrode 15 for sealing and 30 is a semiconductor device including the above mentioned portions according to the this embodiment.

As shown in FIG. 5A, in a first example of a semiconductor device 30 according to this third embodiment, a connecting conductor 5a is formed on the electrode pad 1 on the semiconductor substrate, and is positioned to face an opening 23. A terminal electrode 15 is provided on the rear surface, i.e., on the surface away from the semiconductor substrate 3, of an insulated circuit board 11 around the opening 23. A non-conductive resin 9 is provided to fix the semiconductor substrate 3 and the insulated circuit board 11. A flexible connecting conductor 5b is provided in the opening 23 to connect the connecting conductor 5a and the terminal electrode 15. A sealing non-conductive resin 21 is provided to fill the opening 23 and to cover the connecting conductor 5 and the terminal electrode 15.

This structure is effective to improve the reliability of connection between the electrode pad 1, the connecting conductor 5, and the terminal electrode 15. This structure is effective to facilitate the design of the conductive layer 13 on the insulated circuit board 11 by optimizing the length of the flexible connecting conductor 5.

Next, as shown in FIG. 5B, in a second example of a semiconductor device 30 according to the third embodiment, a flexible connecting conductor 5b is: connected to the connecting conductor 5a by means of a intermediate connecting material. Alternatively, the flexible connecting conductor 5b is made from a plurality of kinds of materials. The other portions are same with the structure of FIG. 5A.

Next, as shown in FIG. 5C, in a third example of a semiconductor device 30 according to the third embodiment, a non-conductive resin 9 and the non-conductive resin 21 are formed integral. The non-conductive resin 21 is pressed through the opening 23 into the gap between the semiconductor substrate 3 and the insulated circuit board 11 to form a non-conductive resin 9, by temporally holding the semiconductor substrate 3 and the insulated circuit board 11 with a gap therebetween. In this structure, similar effects as in FIG. 5A is obtained.

Now, a method of fabricating the semiconductor device 30 according to the third embodiment will be described with reference to FIGS. 6A and 6B. FIGS. 6A and 6B are sectional views each showing a connection portion between the semiconductor substrate and the insulated circuit board of the semiconductor substrate according to the third embodiment for illustrating the method of fabricating the semiconductor device. An arrow in the left side drawing indicates to press a semiconductor substrate toward a insulated circuit board, and an arrow between the left side drawing and the right side drawing indicates that the process proceeds from the left side status to the right side status.

As shown in FIG. 6A, in a first example of a method of fabricating a semiconductor device according to this third embodiment, a non-conductive resin 9 (film) is disposed on a insulated circuit board 11 having an opening 23. A connecting conductor 5 is formed on a electrode pad 1 on a semiconductor substrate 3. Then, the semiconductor substrate 3 is positioned relative to an insulated circuit board 11 in such a manner that a connecting conductor 5 formed is aligned to the opening 23 in the insulated circuit board 11. The connecting conductor 5 is pressed and inserted into the non-conductive resin 9 from the semiconductor substrate 3 side. Then, a flexible connecting conductor 5b is connected to the connecting conductor 5a via a connecting conductor 5c, and the other end of the connecting conductor 5b is connected to the terminal electrode 15. thereafter, a non-conductive resin 21 is overlaid on the connecting conductor 5 for sealing. The structure as shown in FIG. 5B is thus obtained.

In this example of a method of fabricating a semiconductor device, a wire-like connecting conductor 5b may be wire bonded to a connecting conductor 5a in a through hole 23, which leads to a structure shown in FIG. 5A. Alternatively, a lump-like connecting conductor 5c may be formed by a wire bonding as shown in FIG. 5B. Further, a lump-like connecting conductor 5c may be formed via a through hole 23 after positioning the semiconductor substrate 3 with the insulating circuit board 11. Thereafter, a connecting conductor 5b may be connected to the connecting conductor 5c. Thus, a structure shown in FIG. 5B may be fabricated.

Next, as shown in FIG. 6B, in a second example of a method of fabricating a semiconductor device according to the third embodiment, a semiconductor substrate 3 is positioned relative to an insulated circuit board 11 in such a manner that a connecting conductor 5a formed on the electrode pad 1 on the semiconductor substrate 3 is aligned to the opening 23 in the insulated circuit board 11, and the connecting conductor 5a is inserted into the opening 23 from the semiconductor substrate 3 side. Then, the semiconductor substrate 3 and the insulated circuit board 11 are temporally hold, and a flexible connecting conductor 5b is connected to the connecting conductor 5a and the terminal electrode 15. Then, a non-conductive resin is applied to form a non-conductive resin 9 and a non-conductive resin 21 for sealing. The structure as shown in FIG. 5C is thus obtained.

In this embodiment as described above, a connecting conductor 5b may be connected to al connecting conductor 5c or 5a by a wire bonding method for example, and not directly to an electrode pad 1. Therefore, the connecting work is done easily, particularly in a case where a diameter of the through hole 23 is small.

In this embodiment, the semiconductor substrate 3 is fixed to the insulated circuit board 11 by using the non-conductive 30 resin 9, or by using a jig between the semiconductor substrate 3 and the insulated circuit board 11, or by an adhesion force applied between the semiconductor substrate 3 and the insulated circuit board 11, for example by the projection (connecting conductor 5) formed on the semiconductor substrate 3. The method of fixing the semiconductor substrate 3 to the insulated circuit board 11 by using the projection (connecting conductor 5) formed on the semiconductor substrate 3 is often performed by use of the contact between the opening 23 and the connecting conductor 5 formed on the electrode pad 1 on the semiconductor substrate 3.

Fourth Embodiment

Figure 7A:
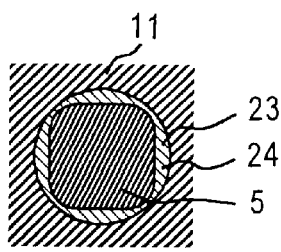
FIGS. 7A to 7D are cross sectional views each showing an opening cut along a plane parallel to an insulated circuit board of a semiconductor device according to a fourth embodiment of the present invention.
Figure 7B:
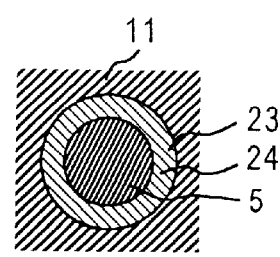
Figure 7C:
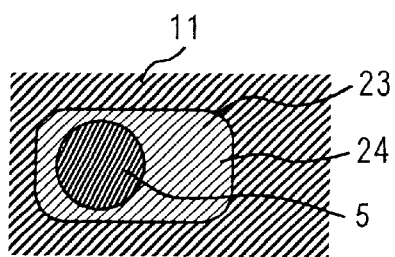
Figure 7D:
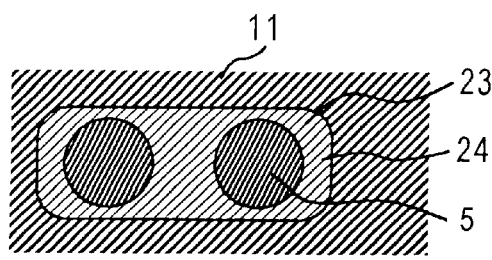
Figure 8:
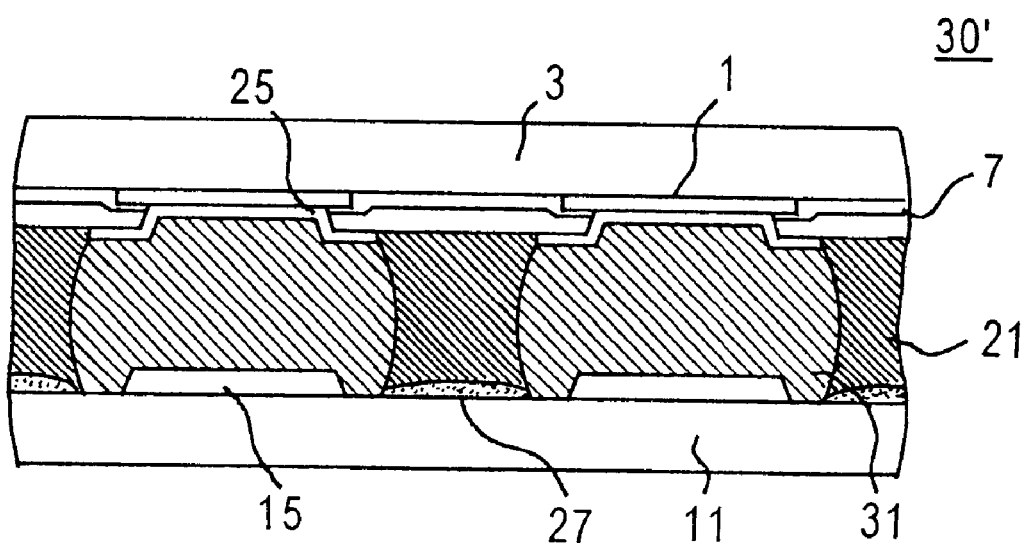
FIG. 8 is a sectional view showing a connection portion between a semiconductor substrate and an insulated circuit board in a prior art semiconductor device in which the semiconductor substrate is mounted on the insulated circuit board.

Hereinafter, a fourth embodiment of the present invention will be described in detail with reference to the drawings. FIGS. 7A to 7D are cross sectional views each showing an opening cut along a plane parallel to an insulated circuit board of a semiconductor device according to the fourth embodiment. FIG. 7A shows the state in which a connecting conductor is partially in contact with the inner wall of an opening; and FIG. 7B shows the state in which the connecting conductor is not in contact with the inner wall of an opening. FIGS. 7C and 7D each show a relationship of the size of the connecting conductor to that of the opening.

In FIGS. 7A to 7D, reference numeral 5 designates a connecting conductor; 11 is an insulated circuit board; 23 is an opening in the insulated circuit board 11; and 24 is a gap between the connecting conductor 5 and the inner wall of the opening 23.

As shown in FIG. 7A, in a first example of a semiconductor device according to this fourth embodiment, the connecting conductor 5 is partially, at four points, in contact with the inner wall of the opening 23. In this way, a semiconductor substrate 3 may be fixed to an insulated circuit board 11 in the fabrication step by using the contact between the connecting conductor 5 and the inner wall of the opening 23.

Next, as shown in FIG. 7B, in a second example of a semiconductor device according to this fourth embodiment, a connecting conductor 5 is not in contact with the inner wall of an opening 23. In this case, the semiconductor substrate 3 may be fixed to the insulated circuit board 11 in the fabrication step by using an adhesion force or a fixing means such as a jig. In the case of the device structure shown in FIG. 7B, since the connecting conductor 5 is not in contact with the opening 23, it is possible to obtain an advantage that the connecting conductor 5 does not receive any restricting force from the opening 23 and is not subjected to stress concentration.

In the above mentioned embodiments, the gap 24 between the inner wall of the opening 23 and the connecting conductor 5 may be vacant or may be embedded with a non-conductive resin. Such loose configuration may reduce the stress applied to the connecting conductor 5 rather than the tight configuration.

Next, as shown in FIG. 7C, in a third example of a semiconductor device according to the fourth embodiment, the area of the opening 23 is somewhat elongated in one direction. The plane shape of the opening 23 determines the restricting force applied to the vicinity of the connecting conductor 5. From this viewpoint, according to this example, the area of the opening 23 is somewhat elongated in the direction in which the arrangement pitch is broadened in order to increase the joining area. This is effective in the case where the connecting conductors 5 in the wet state are spread on the terminal electrode 15. The area of the opening 23 may be enlarged in the direction in which the thermal stress is relieved. The stress applied to the connecting conductor 5 is reduced when in contact with a resin in the gap 24.

Next, as shown in FIG. 7D, in a fourth example of a semiconductor device according to the fourth embodiment, two or more connecting conductors 5 may be disposed in one opening 23, in case the arrangement pitch of the connecting conductors 5 is narrow. Thus, the plan shape of the opening 23 may be adjusted to include one isolated connecting conductor 5 or a plurality of connecting conductors 5.

In the above embodiments, the cross-sectional shape of the opening 23 is shown either as circular or rectangular.

However, the cross-sectional shape of the opening 23 may be selected to be any optional shape including square or oval shape.

Further, the relationship between the connecting conductor and the opening 23 as explained above may be selected and applied to each structure described in the first to third embodiments.

While the preferred embodiments of the present invention have been described using specific terms such as the numbers, positions, and shapes of the components, such description is for illustrative purposes only, and it is to be understood that changes and variations may be made without departing from the spirit or scope of the following claims.

According to the present invention configured as described above, the height of a connecting conductor may be increased by making use of an opening provided in an insulated circuit board. The increase in stress of the connecting conductor may be reduced by connecting the connecting conductor to the terminal electrode on the back surface of the insulated circuit board via the opening. The joining strength between the semiconductor substrate and the insulated circuit board may be increased by taking the inner wall surface of the opening as a joining area.

As a result, the reliability of connection between the electrode pad on the semiconductor substrate and terminal electrode of the insulated circuit board is increased. The reliability in connection between the electrode pad and the terminal electrode is ensured even when the arrangement pitch of the electrode pads becomes narrower along with the higher degree of integration of the semiconductor device.

For a convenience, a method of fabricating a semiconductor device according to the present invention may be summarized as follows.

According to one aspect, a method of fabricating a semiconductor device comprising the steps of: forming an opening in an insulated circuit board from a main surface reaching a terminal electrode, the insulated circuit board having a main surface and rear surface, the insulated circuit board including the terminal electrode at the rear surface or at an intermediate plane between the main surface and the rear surface; mounting a semiconductor substrate on the main surface of said insulated circuit board while aligning an electrode pad on said semiconductor substrate to said terminal electrode on said insulated circuit board; forming a connecting conductor through the opening for connecting the electrode pad on the semiconductor substrate with the terminal electrode on the insulated circuit board.

In another aspect, the method further includes the steps of: disposing the connecting conductor on the electrode pad of the semiconductor substrate before mounting the semiconductor substrate; and disposing a non-conductive resin on the main surface of the insulated circuit board before mounting the semiconductor substrate.

In another aspect, the method further includes the steps of: disposing a portion of the connecting conductor on the electrode pad of the semiconductor substrate before mounting the semiconductor substrate; disposing another portion of the connecting conductor in the opening in the insulated circuit board before mounting the semiconductor substrate; and disposing a non-conductive resin on the main surface of the insulated circuit board before mounting the semiconductor substrate.

According to another aspect, a method of fabricating a semiconductor device comprises the steps of: disposing a first connecting conductor on an electrode pad of a semiconductor substrate; forming an opening in an insulated circuit board, the insulated circuit board having a main surface and a rear surface, the insulated circuit board having a terminal electrode on the rear surface near the opening; mounting the semiconductor substrate on the main surface of: said insulated circuit board while aligning the connecting conductor to said opening in the insulated circuit board; disposing a second connecting conductor in the opening for connecting the first connecting conductor with the terminal electrode on the insulated circuit board; and disposing a non-conductive resin on the rear surface of the insulated circuit board for covering the first and second connecting conductors and the terminal electrode.

In another aspect, in the method, the connecting conductor on the electrode pad is disposed in the opening to partially contact the inner surface of the opening.

In another aspect, in the method, the connecting conductor on the electrode pad is disposed in the opening not to contact the inner surface of the opening.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 20000-30651, filed on Feb. 8, 2000 including specification, claims, drawings and summary, on which the Convention priority of the present application is based, are incorporated herein by reference in its entirety.

What is claimed is:

1. A semiconductor device comprising:
   a semiconductor substrate including an electrode pad,
   an insulated circuit board having a main surface and a rear surface, said insulated circuit board being disposed with its main surface facing said electrode pad of said semiconductor substrate, said insulated circuit board having a terminal electrode disposed at the rear surface or between the main surface and the rear surface, said insulated circuit board having an opening at a position opposite to said electrode pad and formed from the main surface up to said terminal electrode; and
   a connecting conductor disposed through said opening; said connecting conductor connecting said electrode pad on said semiconductor substrate with said terminal electrode on said insulated circuit board.

2. The semiconductor device according to claim 1, wherein
   said insulated circuit board includes a plurality of conductive layers either on the main surface, on the rear surface, or on an intermediate plane between the main surface and the rear surface.

3. The semiconductor device according to claim 1, wherein
   said connecting conductor is composed of a plurality of materials jointed together.

4. The semiconductor device according to claim 1, wherein
   said connecting conductor is formed of a continuous body of a same substance.

5. The semiconductor device according to claim 1, wherein
   said connecting conductor is formed to partially contact the inner surface of said opening or not to contact the inner surface of said opening.

6. The semiconductor device according to claim 5, wherein a gap between said connecting conductor and the inner surface of said opening is vacant or embedded with a non-conductive resin.

7. The semiconductor device according to claim 1, further including
   a non-conductive resin disposed between said semiconductor substrate and said insulated circuit board.

8. A semiconductor device comprising:
   a semiconductor substrate including an electrode pad,
   an insulated circuit board having a main surface and a rear surface, said insulated circuit board being disposed with its main surface facing said electrode pad off said semiconductor substrate, said insulated circuit board having an opening at a position opposite to said electrode pad, said insulated circuit board having a terminal electrode disposed on the inner surface of said opening, and
   a connecting conductor disposed through said opening; said connecting conductor connecting said electrode pad on said semiconductor substrate with said terminal electrode on said insulated circuit board.

9. The semiconductor device according to either of claim 8, wherein
   said insulated circuit board includes a plurality of conductive layers either on the main surface, on the rear surface, or on an intermediate plane between the main surface and the rear surface.

10. The semiconductor device according to claim 8, wherein
    said connecting conductor is composed of a plurality of materials jointed together.

11. The semiconductor device according to claim 8, wherein
    a gap between said connecting conductor and the inner surface of said opening is vacant or embedded with a non-conductive resin.

12. The semiconductor device according to claim 8, further including
    a non-conductive resin disposed between said semiconductor substrate and said insulated circuit board.

13. A semiconductor device comprising:
    a semiconductor substrate including an electrode pad,
    an insulated circuit board having a main surface and a rear surface, said insulated circuit board being disposed with its main surface facing said electrode pad of said semiconductor substrate, said insulated circuit board having an opening at a position opposite to said electrode pad; said insulated circuit board having a terminal electrode at a position on the rear surface near said opening, and
    a connecting conductor disposed through said opening; said connecting conductor connecting said electrode pad on said semiconductor substrate with said terminal electrode on said insulated circuit board.

14. The semiconductor device according to claim 13, wherein said insulated circuit board includes a plurality of conductive layers either on the main surface, on the rear surface, or on an intermediate plane between the main surface and the rear surface.

15. The semiconductor device according to claim 13, wherein
    said connecting conductor is composed of a plurality of materials jointed together.

16. The semiconductor device according to claim 13, wherein
    said connecting conductor is composed of a lump portion joined to said electrode pad of said semiconductor substrate and a line portion running from the lump portion to said terminal electrode on said insulated circuit board.

17. The semiconductor device according to claim 13, further including:
    a sealing resin covering said connecting conductor from the rear surface side of said insulated circuit board.

18. The semiconductor device according to claim 13, wherein
    said connecting conductor is formed to partially contact the inner surface of said opening or not to contact the inner surface of said opening.

19. The semiconductor device according to claim 13, wherein
    a gap between said connecting conductor and the inner surface of said opening is vacant or embedded with a non-conductive resin.

20. The semiconductor device according to claim 13, further including
    a non-conductive resin disposed between said semiconductor substrate and said insulated circuit board.

* * * * *